(12) United States Patent
Shen

(10) Patent No.: US 12,381,125 B1
(45) Date of Patent: Aug. 5, 2025

(54) STRUCTURAL SCREEN WINDOW LIQUID METAL THERMAL INTERFACE PAD

(71) Applicant: Yuci Shen, Livermore, CA (US)

(72) Inventor: Yuci Shen, Livermore, CA (US)

( * ) Notice: Subject to any disclaimer, the term of this patent is extended or adjusted under 35 U.S.C. 154(b) by 0 days.

(21) Appl. No.: 18/732,626

(22) Filed: Jun. 4, 2024

Related U.S. Application Data

(63) Continuation-in-part of application No. 18/537,665, filed on Dec. 12, 2023.

(51) Int. Cl.
  *H01L 23/373* (2006.01)
  *H01L 23/367* (2006.01)
  *H01L 23/495* (2006.01)
  *H01L 23/427* (2006.01)
  *H01L 23/473* (2006.01)

(52) U.S. Cl.
  CPC ...... *H01L 23/3736* (2013.01); *H01L 23/3677* (2013.01); *H01L 23/49568* (2013.01); *H01L 23/427* (2013.01); *H01L 23/473* (2013.01)

(58) Field of Classification Search
  CPC ............. H01L 23/3736; H01L 23/3677; H01L 23/49568; H01L 23/473; H01L 23/427
  See application file for complete search history.

(56) References Cited

U.S. PATENT DOCUMENTS

| | | | |
|---|---|---|---|
| 10,170,392 B2 * | 1/2019 | Chainer | H01L 21/4871 |
| 2019/0237342 A1 * | 8/2019 | Shen | H01L 23/4985 |
| 2021/0242098 A1 * | 8/2021 | Sinha | H01L 21/52 |

* cited by examiner

*Primary Examiner* — Patricia D Valenzuela

(57) ABSTRACT

The disclosure describes a screen window liquid metal pad disposed between two opposing elements of an electronic device so as to provide a thermal pathway for an efficient heat transfer from one element to the other, comprising: a screen window and a liquid metal, wherein the screen window includes a frame with a window and a thermal conductive mesh; wherein the frame includes a top piece and a bottom piece, a peripheral portion of the thermal conductive mesh is fixed between the top and bottom pieces through an adhesive and the remaining portion forms a window screen covering the window of the frame; and wherein the liquid metal fills in and covers at least part of a middle portion of the window screen.

12 Claims, 20 Drawing Sheets

STRUCTURAL SCREEN WINDOW LIQUID METAL THERMAL INTERFACE PAD

The present application is a continuation-in-part of U.S. patent application Ser. No. 18/537,665, filed Dec. 12, 2023.

TECHNICAL FIELD OF THE DISCLOSURE

The disclosure relates generally to a thermal interface material (TIM), and particularly to a thermal interface pad disposed between two opposing elements such as a heat generating element like a flip chip and a heat dissipating element like a lid or heatsink of an electronic device including a flip chip package so as to transfer heat from one to the other.

BACKGROUND OF THE DISCLOSURE

In an electronic device with a semiconductor chip being a heat-generating element, a thermal interface material (TIM) is needed to fill a gap between the semiconductor chip and a heat-dissipating element. One example is a TIM is disposed in a gap between a flip chip of a flip chip package and a cooler (like a heatsink or a cold plate) mounted over the flip chip package, and another example is a TIM is disposed in a gap between a lid of a lidded flip chip package and a cooler (like a heatsink or a cold plate) mounted over the lid of the lidded flip chip package. The different types of TIM basically include thermal pads, thermal greases, phase change materials and liquid metals. Of these types of TIM, a thermal interface pad is easiest to use. Thermal interface pads of prior arts basically include two types of structures. One is based on a thermally conductive particle filled in a matrix material, such as a silicone or resin, and the other is based on a thermally conductive porous pad filled with a resin or other glue type of material. An ideal thermal interface pad is desired to include such features as high thermal conductivity, low contact resistance, compressible/recoverable capability under pressure and long-term stability. However, thermal interface pads of prior arts are always not satisfactory in at least one or two of these mentioned features. To have such an ideal thermal interface pad with all the desired features like high thermal conductivity, low contact resistance, compressible/recoverable capability under pressure and long-term stability, a structural thermal interface pad is described in the present disclosure.

SUMMARY OF THE DISCLOSURE

An electronic device including a structural thermal interface pad disposed between two opposing elements such as a heat generating element like a flip chip and a heat dissipating element like a lid or heatsink of an electronic device including a flip chip package is described in the present invention, wherein a structural thermal interface pad of one preferred embodiment of the present invention, comprising: a structural sheet and a filling material, wherein the structural sheet with a top surface and a bottom surface includes a first structure and a second structure, the first structure is an array of small holes completely passing through the sheet from its top surface to its bottom surface, and the second structure is an array of convex and/or concave bowls on the top surface and/or on the bottom surface of the structural sheet; and wherein the filling material fills in a space of the structural sheet, covering at least a portion of the top surface and a portion of the bottom surface of the structural sheet.

A structural thermal interface pad of another preferred embodiment of the present invention, comprising: a structural pillow and a filing material, wherein the structural pillow with a top surface and a bottom surface includes an upper sheet, a lower sheet and a middle sheet, each sheet has a top surface and a bottom surface, the upper and lower sheets form an envelope, enclosing the middle sheet inside; wherein each sheet includes an array of small holes completely passing through the sheet from its top surface to its bottom surface; the middle sheet includes a first structure and a second structure, the first structure is the array of small holes, and the second structure is an array of convex and/or concave bowls on the top surface and/or on the bottom surface of the structural sheet; and wherein the filling material fills in a space of the structural pillow, covering at least a portion of the top surface and a portion of the bottom surface of the structural pillow.

The features and advantages of the embodiments of the present invention will become more apparent from the detailed descriptions in conjunction with the drawings below. The drawings and associated descriptions are to illustrate the embodiments of the present disclosure, not to limit the scope of what is claimed.

DETAILED DESCRIPTION OF THE PREFERRED EMBODIMENT

Figure 1:
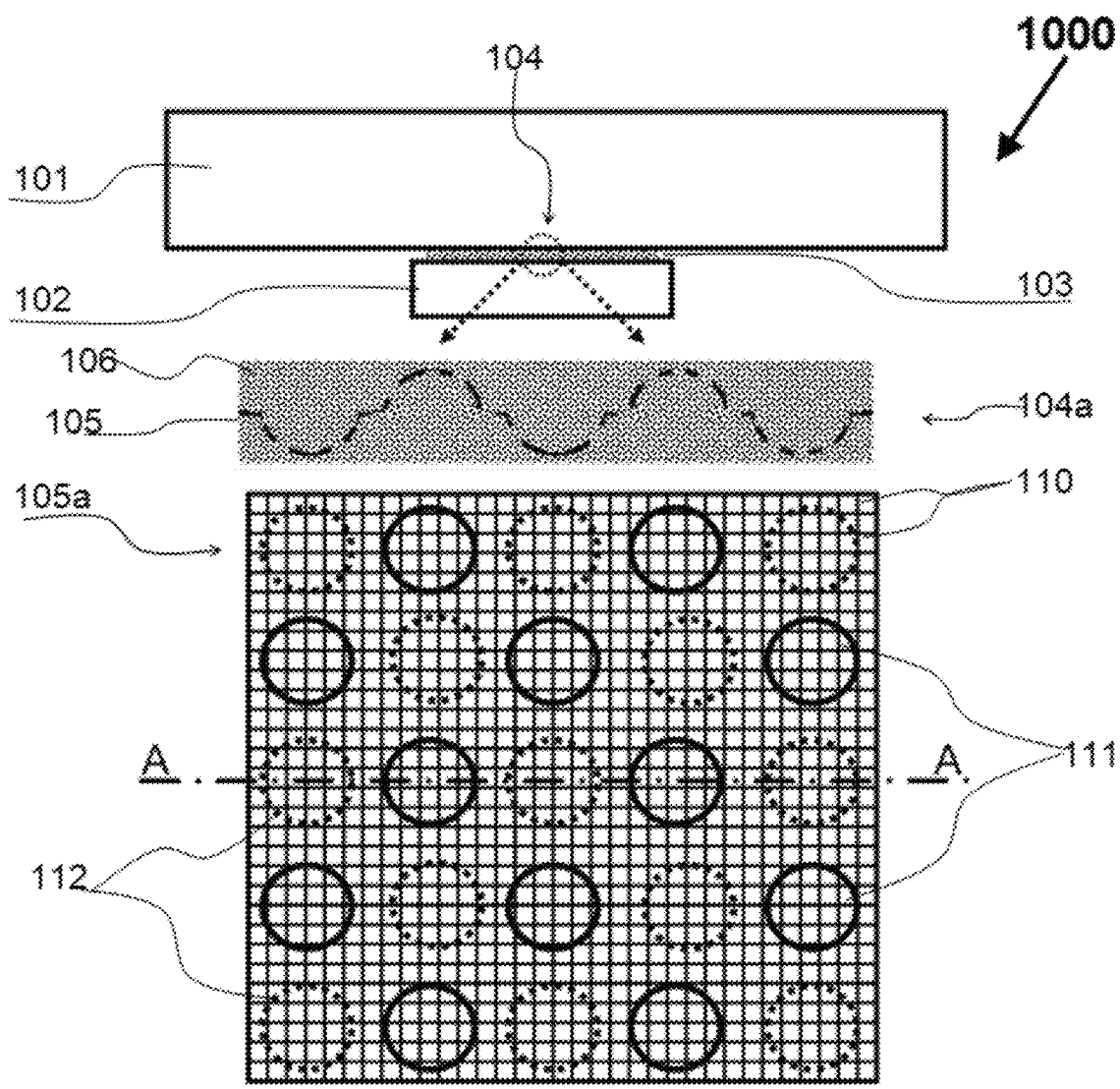
FIG. 1 is a schematic diagram for illustrating a structural thermal interface pad disposed two opposing elements of an electronic device of one preferred embodiment of the present invention.

FIG. 1 is a schematic diagram for illustrating a structural thermal interface pad disposed between two opposing elements of an electronic device of one preferred embodiment of the present invention. The numerical symbol 1000 in FIG. 1 designates an electronic device, including two opposing elements 101 and 102, and a structural thermal interface pad 103, in which the structural thermal interface pad 103 is disposed between the two opposing elements 101 and 102 to provide a thermal pathway for heat transfer from one to the other. A small portion of the structural thermal interface pad 103 as illustrated in a dash circle 104 is enlarged for a detailed view as designated by 104a, in which the numerical symbols 105 and 106 respectively designate a structural sheet and a filling material. The numerical symbol 105a is for illustrating the structural sheet 105 from its top view, such that the 105 can be viewed as a cross-section along the dashed line A of the top view 105a. As illustrated by the cross-sectional and top views 105/105a of the structural sheet 103, it has a top surface and a bottom surface and includes a first structure and a second structure, wherein the first structure is an array of small holes 110 completely passing through structural sheet 103 from its top surface to its bottom surface, and the second structure is an array of convex and/or concave bowls 111 and 112 on the top surface and/or on the bottom surface of the sheet 105/105a, which can be formed by extruding the structural sheet outwards from its top surface and/or bottom surface. The filling material 106 fills in a space of the structural sheet 105, covering at least a portion of the top surface and a portion of the bottom surface of the structural sheet 105, as illustrated by the enlarged view 104a. The first structure 110 and the second structure 111/112 of the structural sheet 105 and more features of the structural thermal interface pad 103 will be further illustrated in conjunction with drawings below.

Figure 1A:
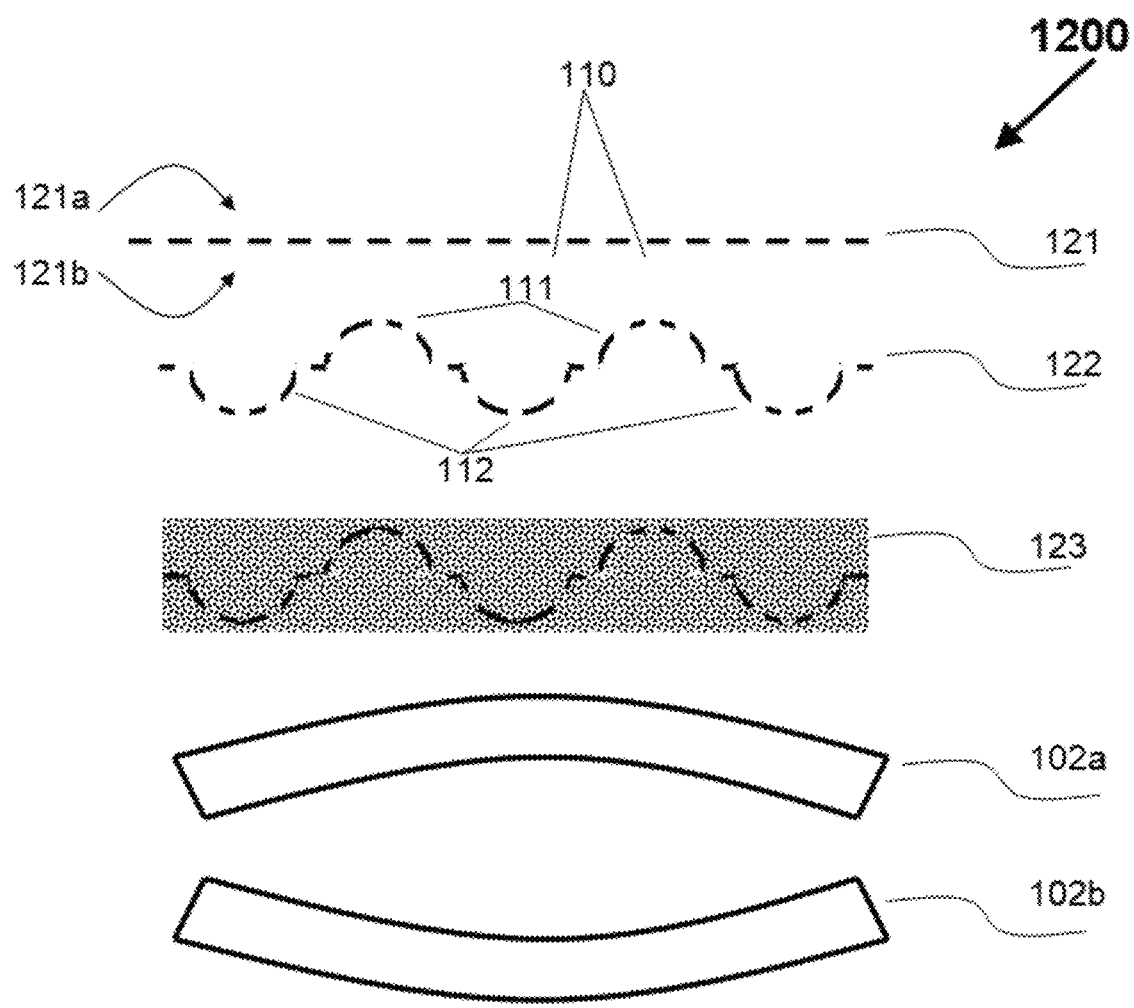
FIG. 1A is a schematic diagram for further illustrating the structural thermal interface pad as shown in FIG. 1.

FIG. 1A is a schematic diagram for further illustrating the structural thermal interface pad as shown in FIG. 1. The numerical symbol 1200 in FIG. 1A designates some elements for illustrating a method of designing the first structure 110 and the second structure 111/112 in the structural sheet 105 as shown in FIG. 1, in which the numerical symbol 121 designates a sheet with an array of small holes 110, the 121a and 121b designate a top surface and a bottom surface of the sheet 121, the 122 designates a structural sheet having an array of convex and/or concave bowls 111/112 on its top surface 121a and/or bottom surface 121b, which can be formed by extruding the sheet 121 outwards from its top surface 121a and/or bottom surface 121b, the 123 designates a filling material which fills in a space of the structural sheet 105 as shown in FIG. 1, including the array of small holes 110 and the array of convex and/or concave bowls 111/112, and the filling material also covers at least a portion of the top surface and a portion of the bottom surface of the structural sheet 105. The 102a and 102b in FIG. 1A designate a deformation or warpage of the element 102 of the electronic device 1000 as shown in FIG. 1 due to a temperature change. When the element 102, such as a flip chip of a flip chip package or a lid of a lidded flip chip package, warps upwards or downwards due to a temperature change, the volume and thickness of the gaps among the element 102, the structural sheet 105 and the element 103 as shown in FIG. 1 will change. When this happens, the array of convex and/or concave bowls 111/112 can deform under a pressure according to the change of the volume and thickness, and the array of small holes can allow the filling material to pass from one side to the other side of the structural sheet 105. In such a way, a filling material with fluidity, like a liquid metal, can be used with the structural sheet to achieve an ideal thermal interface pad with the features like high thermal conductivity, low contact resistance, compressible/recoverable capability under pressure and long-term stability.

It is noted that a mesh, like a copper mesh or a carbon-fiber mesh can be used as a structural sheet with an array of small holes, an array of convex and/or concave bowls can be made by extruding the mesh, and various shapes of convex and/or concave bowls can be made, not limited to a circular shape as illustrated in FIG. 1 and FIG. 1A. Even though a structural thermal interface pad based on a copper mesh and a liquid metal are preferred in one embodiment of the present invention, a thermally-conductive paste or mud as a filling material can also be used together with a structural sheet based on a copper mesh or a carbon-fiber mesh according to a specific application. According to a specific application, the dimensions of the array of small holes and the array of bowls of the structure sheet can be designed, such as a preferable hole to hole pitch of about 20 um to 50 um and a preferable bowl to bowl pitch of about 500 um to 1000 um for a structure thermal interface pad to transfer heat from a flip chip to other elements, like a lid or heatsink. Furthermore, the array of bowls on the top surface and/or on the bottom surface of the sheet preferably have a height of about 100 um to 500 um. In general, the bowl to bowl pitch is preferably much larger than the hole to hole pitch, like larger by about 5 to 50 times. It is also noted that even though a structural thermal interface pad including one layer of structural sheet is illustrated, a structural thermal interface pad including more layers of structural sheets can be similarly made when needed in a specific application.

Figure 2:
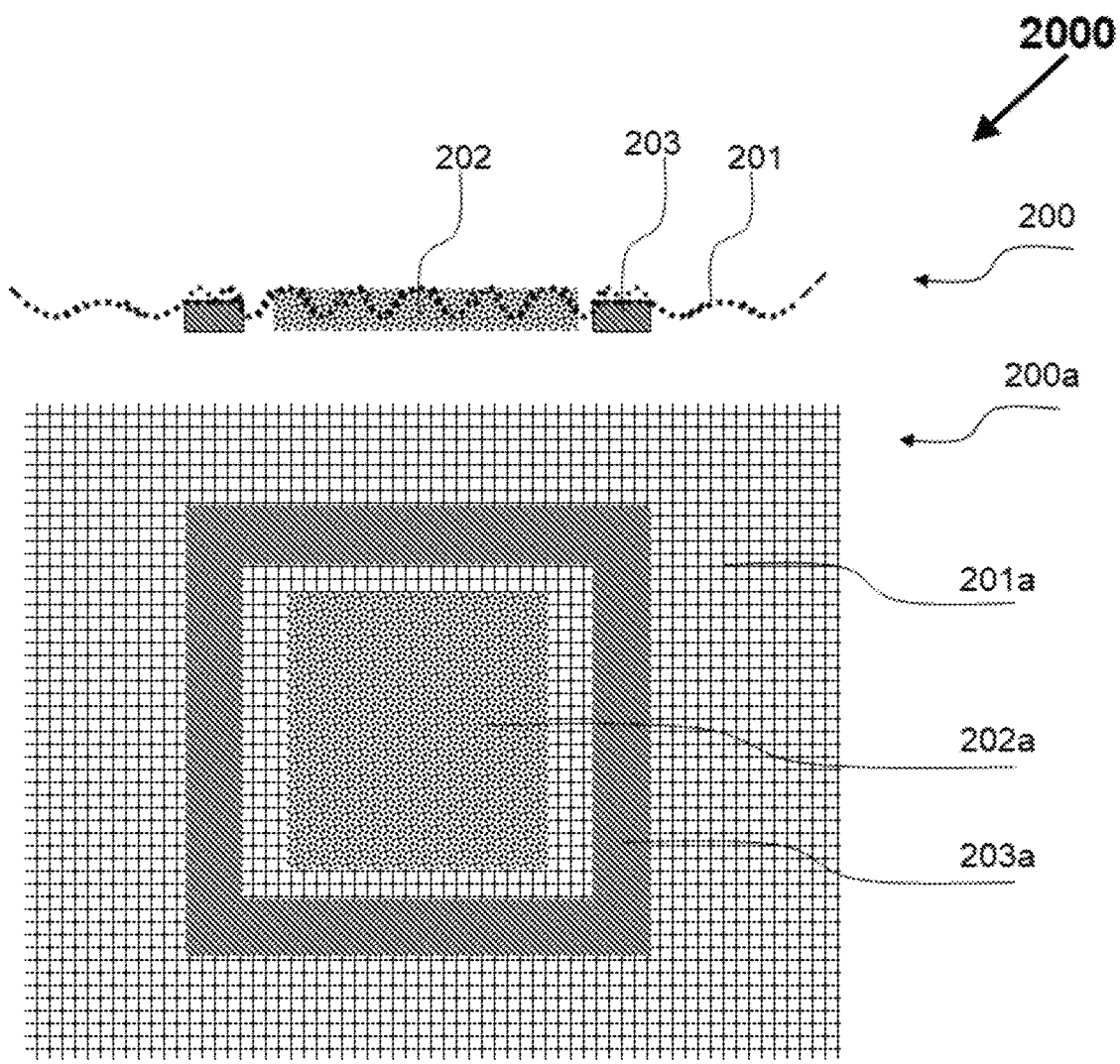
FIG. 2, FIG. 2A and FIG. 2B are schematic diagrams for illustrating that the structural thermal interface pad as shown in FIG. 1 can further include some other features, like a ring-form of adhesive, glue or rubber on its bottom surface and/or a positioning rim along its peripheral edge.
Figure 2A:
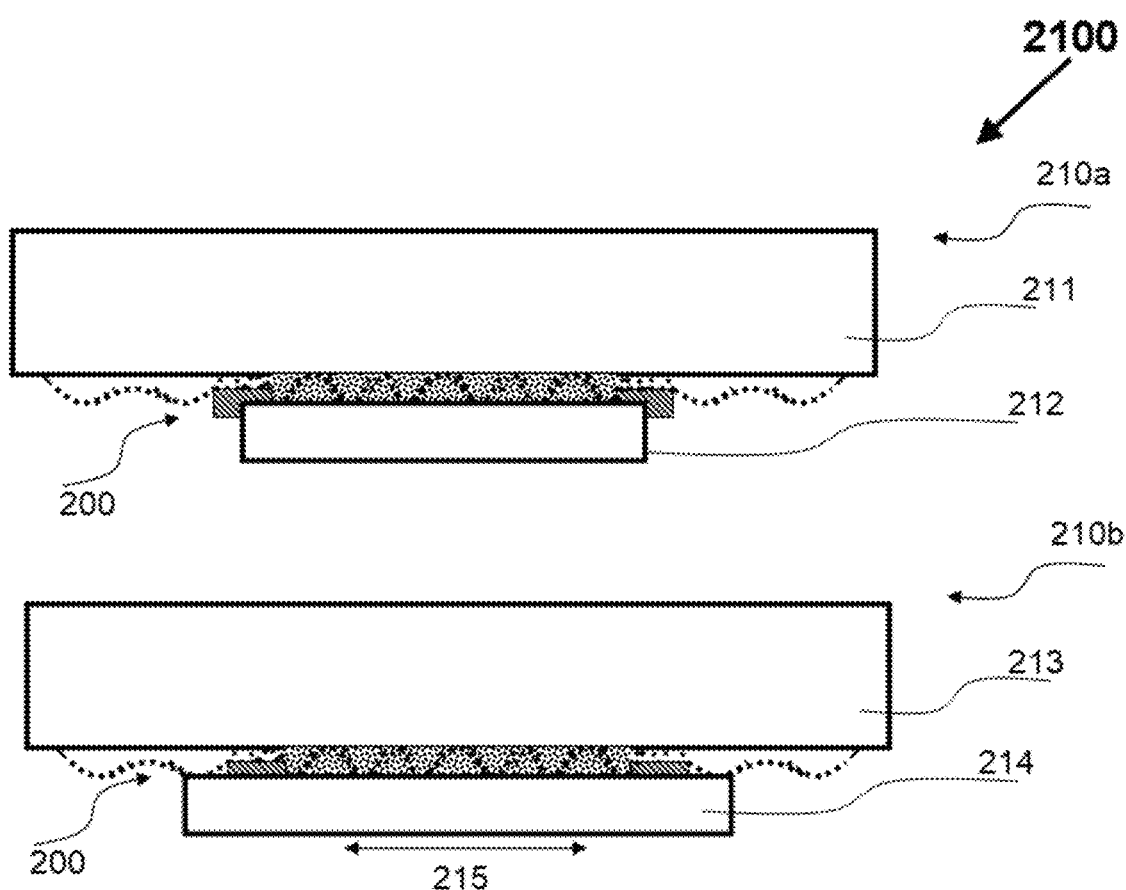

FIG. 2 and FIG. 2A are schematic diagrams for illustrating that the structural thermal interface pad as shown in FIG. 1 and FIG. 1A further includes a ring-form of adhesive, glue or rubber on its bottom surface. The numerical symbol 2000 in FIG. 2 designates a structural thermal interface pad, in which the numerical symbol 200 designates a structural thermal interface pad including a structural sheet 201, a filling material 202 and a ring-form of adhesive, glue or rubber 203 on the bottom surface of the structural sheet 201. The numerical symbol 200a designates a bottom view of the structural thermal interface pad 200 to further illustrate the ring-form of adhesive, glue or rubber 203, in which the 201a, 202a and 203a designate the 201, 202 and 203 from their bottom views, respectively. It is seen that the filling material 202 is preferably filled in a portion of the structural sheet 201 according to an area of a heat generating element of an electronic device. The numerical symbol 2100 in FIG. 2A designates that the structural thermal interface pad 200 is disposed in a gap between a heat dissipating element and a heat generating element, in which the 200a designates the structural thermal interface pad 200 is disposed in a gap between a heat dissipating element 211 and a heat generating element 212, wherein the ring-form of adhesive, glue or rubber 203 as shown in FIG. 2 is arranged along a peripheral edge of the heat generating element 212, such as a flip chip; and the numerical symbol 210b designates the structural thermal interface pad 200 is disposed in a gap between a heat dissipating element 213 and a heat generating element 214, such as a flip chip and a lid of a lidded flip chip package, wherein the ring-form of adhesive, glue or rubber 203 is arranged at an inner region inside a peripheral edge of the heat generating element 214. It is noted that the ring-form of adhesive, glue or rubber 203 as shown in FIG. 2 on the bottom surface of the structural sheet 201 is designed to avoid the filling material 202/202a as shown in FIG. 2 to flow out from the peripheral edge of the heat generating element 212 or 214. It is also noted that depending on a specific application, a ring-form of adhesive, glue or rubber 203 can be placed at and along a peripheral edge of a heat generating element as shown in the 210a or at a peripheral inner region of a heat generating element as shown in the 210b. In the two examples 210a and 210b, the heat generating element 212 preferably designates a flip chip of a flip chip package, and the heat generating element 214 preferably designates a lidded flip chip package with a flip chip in a smaller region as shown by the arrow 215.

Figure 2B:
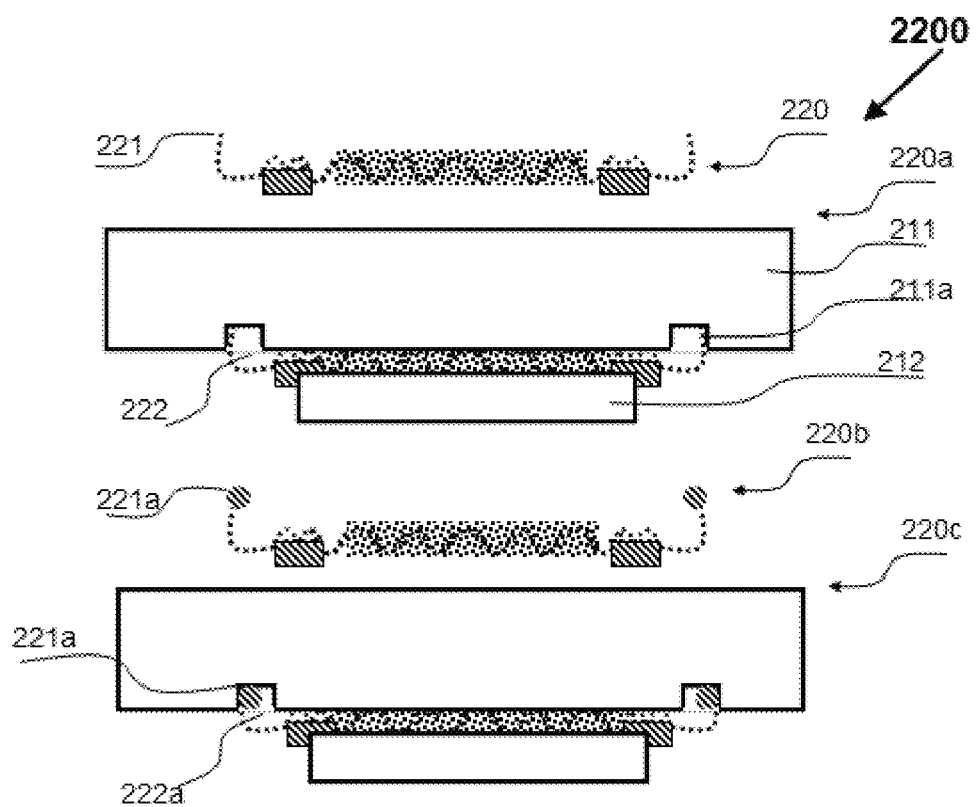

FIG. 2B is a schematic diagram for illustrating that the structural thermal interface pad as shown in FIG. 1 or FIG. 1A further includes a positioning rim along its peripheral edge. The numerical symbol 2200 in FIG. 2B designates a structural thermal interface pad having a positioning rim and its application in an electronic device, in which the 220 designates the structural thermal interface pad further including a positioning rim 221, the 220a designates the structural thermal interface pad 220 is disposed in a gap between a heat dissipating element 211 and a heat generating element 212, wherein the heat dissipating element 211 has a notch 211a for the positioning rim 221 to be placed in, and the 222 designates a cavity formed by the positioning rim 221 and the notch 211a; and the 220b designates the structural thermal interface pad 220 further including a glue edge 221a at an edge region of the positioning rim 221, the 220c designates an application of the structural thermal interface pad 220b, in which the 222a designates a cavity formed by the positioning rim 221 with the glue edge 221a and the notch 211a. It is noted that the cavity 222 and the cavity 222a are for a safety measure in case a filling material, such as liquid metal, flows out from the gap.

Figure 3:
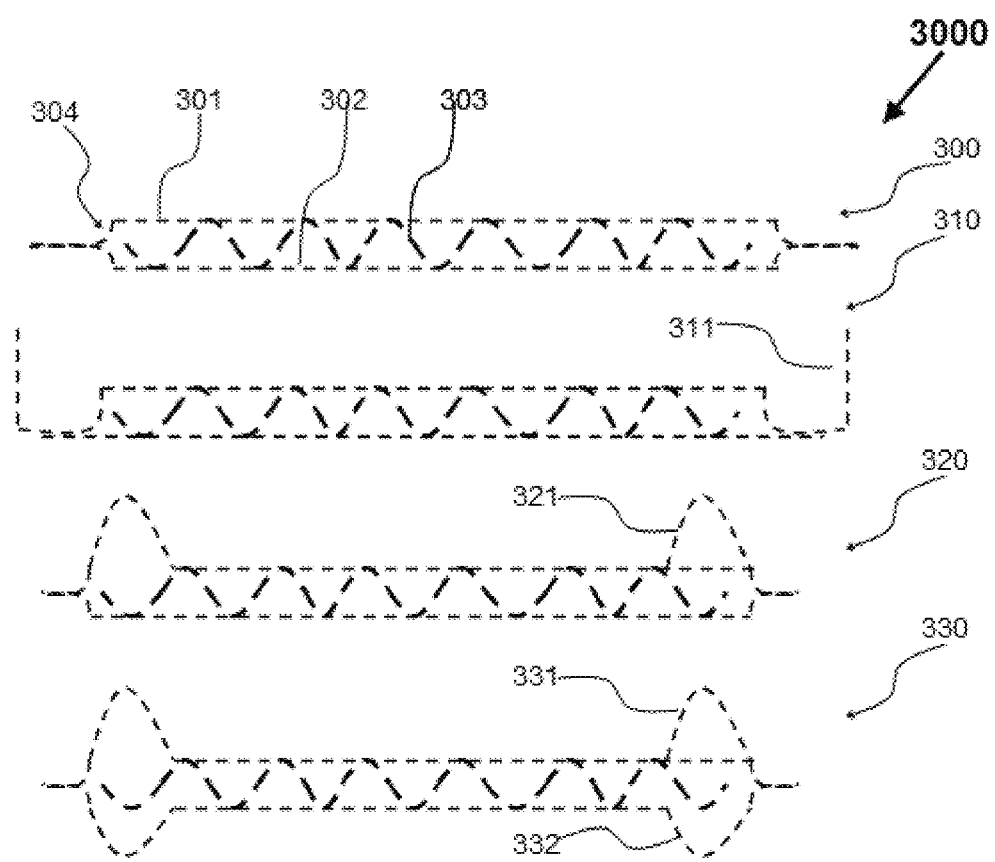
FIG. 3 is a schematic diagram for illustrating a structural pillow for a structural thermal interface pad of another preferred embodiment of the present invention.
Figure 3A:
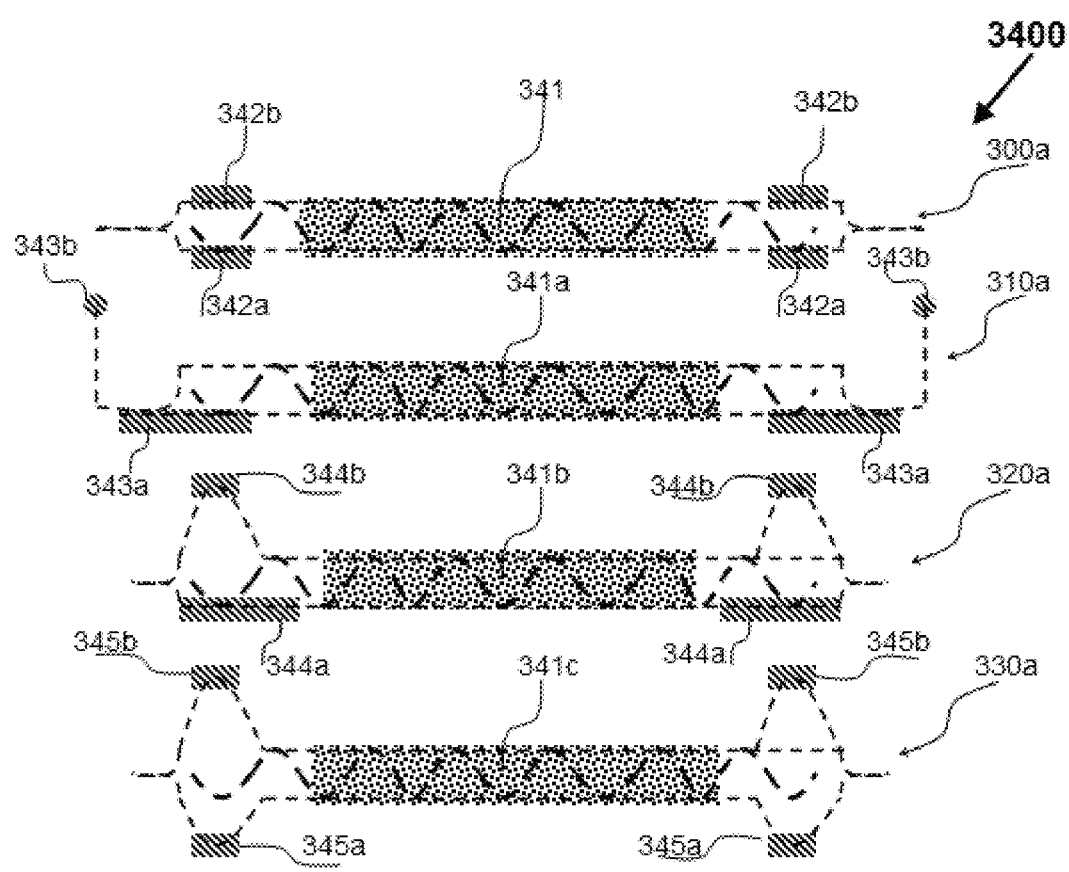
FIG. 3A is a schematic diagram for illustrating a structural thermal interface pad based on a structural pillow of another preferred embodiment of the present invention.

FIG. 3 and FIG. 3A are schematic diagrams for illustrating a structural thermal interface pad of another preferred embodiment of the present invention. The numerical symbol 3000 in FIG. 3 designates a structural pillow with various features, in which the numerical symbol 300 designates a structural pillow with a top surface and a bottom surface, including an upper sheet 301, a lower sheet 302 and a middle sheet 303, wherein each sheet has a top surface and a bottom surface, the upper and lower sheets 301/302 form an envelope 304 that encloses the middle sheet 303 inside, and each sheet includes an array of small holes completely passing through the sheet from its top surface to its bottom surface. The middle sheet 303 includes a first structure and a second structure, as similarly illustrated by the drawings in FIG. 1 and FIG. 1A, wherein the first structure is the array of small holes, and the second structure is an array of convex and/or concave bowls on the top surface and/or on the bottom surface of the middle sheet. The 310 designates that the structural pillow 300 further includes a positioning rim 311 along its peripheral edge; the 320 designates that the structural pillow 300 further includes a bump-form of cavity 321 along its peripheral edge, which can be used as a positioning bump; and the 330 designates that the structural pillow 300 further includes another bump-form of cavity 331/332 along its peripheral edge, which can be used as a positioning bump. It is noted that the usage of the bump-form of cavity 321 and the bump-form of cavity 331/332 will be explained in conjunction with drawings below. The numerical symbol 3400 in FIG. 3A designates a structural thermal interface pad based on the structural pillow as illustrated in FIG. 3, in which the numerical symbol 300a designates a structural thermal interface pad based on the structural pillow 300, including a filling material 341, and preferably further including a ring-form of adhesive, glue or rubber 342a and/or 342b on its bottom and/or top surfaces respectively. The numerical symbol 310a designates a structural thermal interface pad based on the structural pillow 310, including a filling material 341a, and preferably further including a ring-form of adhesive, glue or rubber 343a on its bottom surfaces and/or a ring-form of adhesive or glue edge 343b at an edge region of the positioning rim 311; the numerical symbol 320a designates a structural thermal interface pad based on the structural pillow 320, including a filling material 341b, and preferably further including a ring-form of adhesive, glue or rubber 344a on its bottom surface and/or a ring-form of adhesive, glue or rubber 344b at a top region of the bump-form of cavity 321; and the numerical symbol 330a designates a structural thermal interface pad based on the structural pillow 330, including a filling material 341c, and preferably further including a ring-form of adhesive, glue or rubber 345a at a bottom region of the bump-form of cavity 332 and/or a ring-form of adhesive, glue or rubber 345b at a top region of the bump-form of cavity 331.

Figure 4:
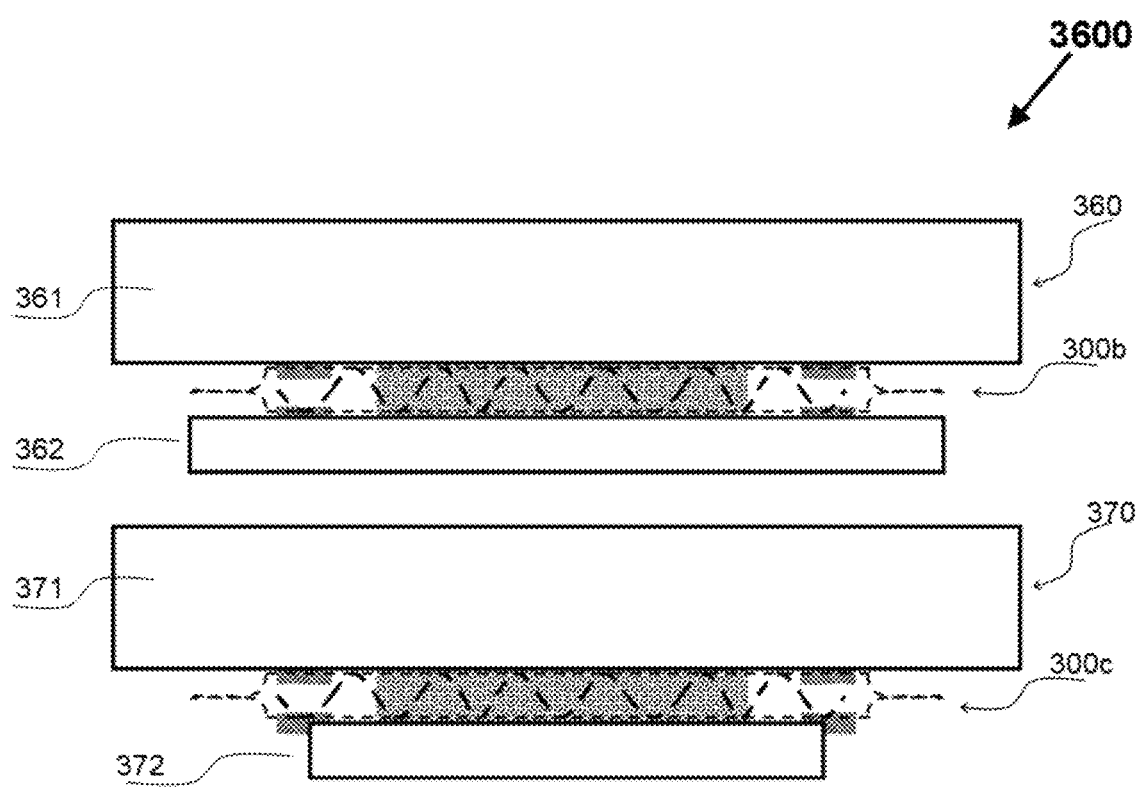
FIG. 4 and FIG. 4A are schematic diagrams for illustrating an electronic device including a structural thermal interface pad as shown in FIG. 3A of one preferred embodiment of the present invention.
Figure 4A:
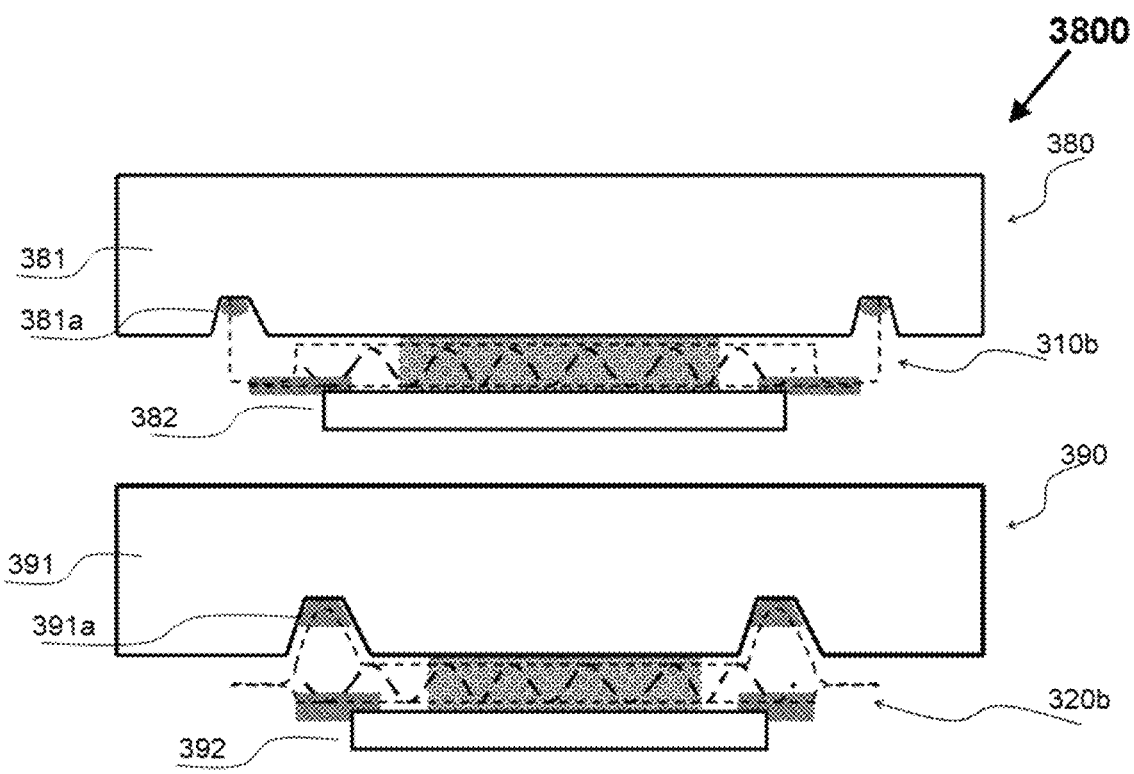

FIG. 4 and FIG. 4A are schematic diagrams for illustrating an electronic device based on the structural thermal interface pad as shown in FIG. 3A, which is disposed in a gap between two opposing elements, such as a heat generating element and a heat dissipating element of the electronic device of one preferred embodiment of the present invention. The numerical symbol 3600 in FIG. 4 is for illustrating two examples of an electronic device having the structural thermal interface pad 300a as shown in FIG. 3A, in which the numerical symbol 360 designates an electronic device including a structural thermal interface pad 300b (or the 300a in FIG. 3A) disposed in a gap between a heat generating element 362 and a heat dissipating element 361 of the electronic device; and the numerical symbol 370 designates an electronic device including a structural thermal interface pad 300c (or the 300a in FIG. 3A) disposed in a gap between a heat generating element 372 and a heat dissipating element 371 of the electronic device. The numerical symbol 3800 in FIG. 4A is for illustrating another two examples of an electronic device having the structural thermal interface pad 310a and 320a as shown in FIG. 3A, in which the numerical symbol 380 designates an electronic device including a structural thermal interface pad 310b (or the 310a in FIG. 3A) disposed in a gap between a heat generating element 382 and a heat dissipating element 381 with a notch 381a of the electronic device; and the numerical symbol 390 designates an electronic device including a structural thermal interface pad 320b (or the 320a in FIG. 3A) disposed in a gap between a heat generating element 392 and a heat dissipating element 391 with a notch 391a of the electronic device.

Figure 5:
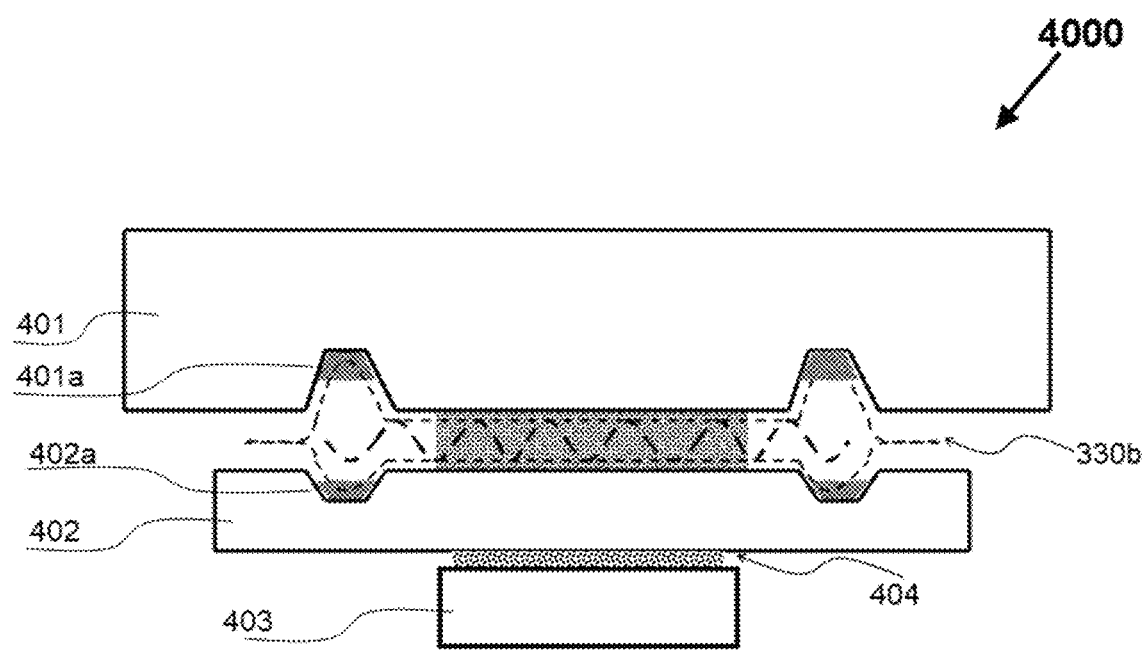
FIG. 5 is a schematic diagram for illustrating an electronic device including a structural thermal interface pad as shown in FIG. 3A of another preferred embodiment of the present invention.

FIG. 5 is a schematic diagram for illustrating an electronic device based on the structural thermal interface pad 330a as shown in FIG. 3A, which is disposed in a gap between a heat generating element and a heat dissipating element of the electronic device of another preferred embodiment of the present invention. The numerical symbol 4000 in FIG. 5 is for illustrating an example of an electronic device with the structural thermal interface pad 330a as shown in FIG. 3A, in which a structural thermal interface pad 330b (or the 330a in FIG. 3A) is disposed in a gap between a heat generating element 402 and a heat dissipating element 401; the 402 and the 401 have a pair of notches 402a and 401a for the bump-form of cavity 332/331 with the ring-form of adhesive, glue or rubber 345a/345b as shown in FIG. 3A to be placed in. It is noted that the electronic device in the example is for a lidded flip chip package, where the 402 is for illustrating a lid, the 403 for a flip chip and the 404 for another TIM between the lid 402 and the flip chip 403 of the lidded flip chip package. It is seen that a heat transfer pathway for the electronic device shown in FIG. 5 is from the flip chip 403 to the lid 402 via 404 and then to the heat dissipating element 401 via 330b. So, the structural thermal interface pad can be disposed in any two opposing elements of an electronic device for an efficient heat transfer between them in the scope of the present invention.

A structural thermal interface pad has been previously disclosed in the U.S. patent application Ser. No. 18/537,665. However, the filling material in the structural thermal interface pad is not completely sealed between the two opposing elements of the electronic device. For a liquid metal as a filling material, there is a concern that leakage of the liquid metal may take place when the electronic device experiences a strong shock or vibration condition. So, a screen window liquid metal pad is disclosed to eliminate this concern in the present application as a continuation-in-part of U.S. patent application Ser. No. 18,537,665, filed Dec. 12, 2023, which is described in conjunction with the drawings from FIG. 6 to FIG. 10A in the following.

Figure 6:
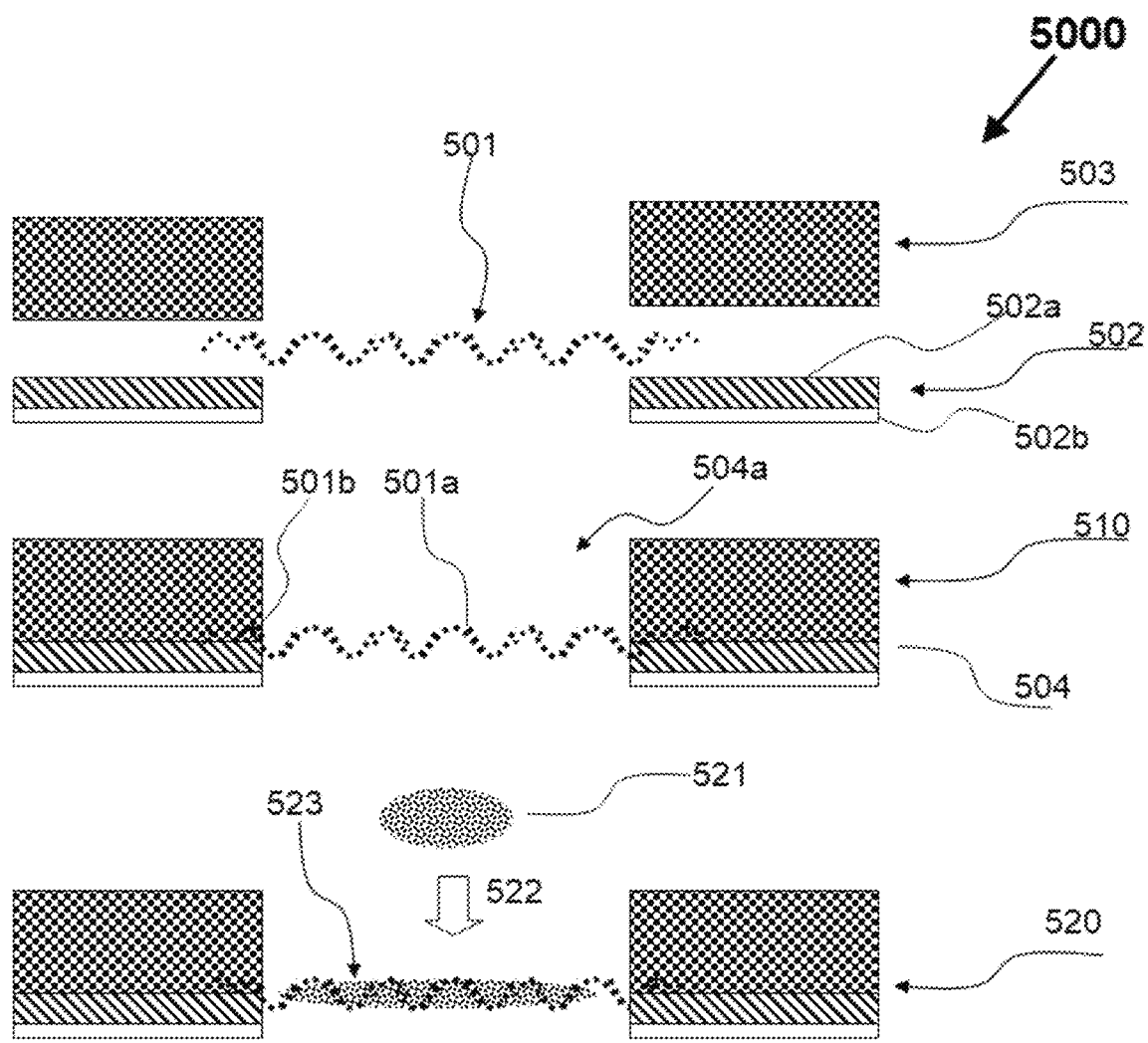
FIG. 6, FIG. 6A and FIG. 6B are schematic diagrams for illustrating a screen window liquid metal pad and some basic steps for making the same of one preferred embodiment of the present invention.
Figure 6A:
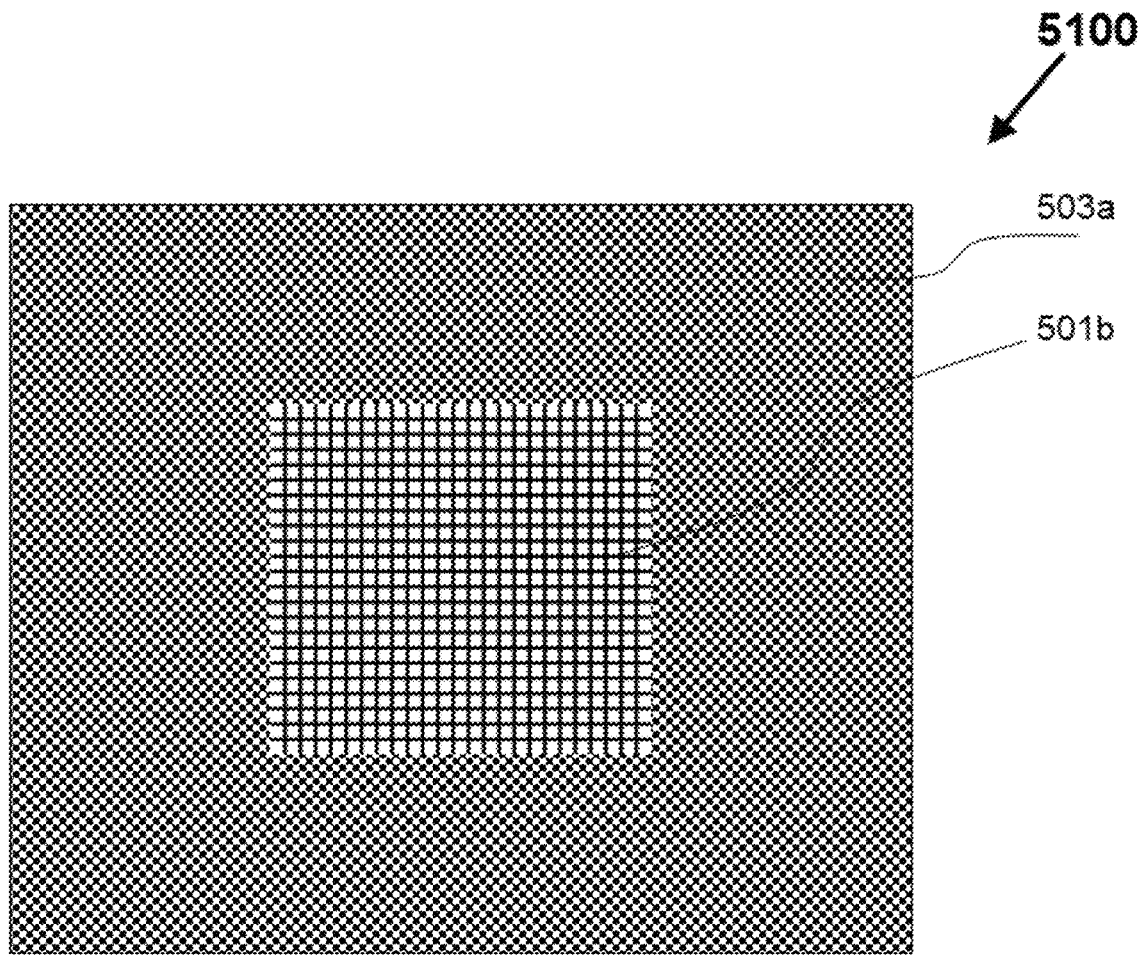
Figure 6B:
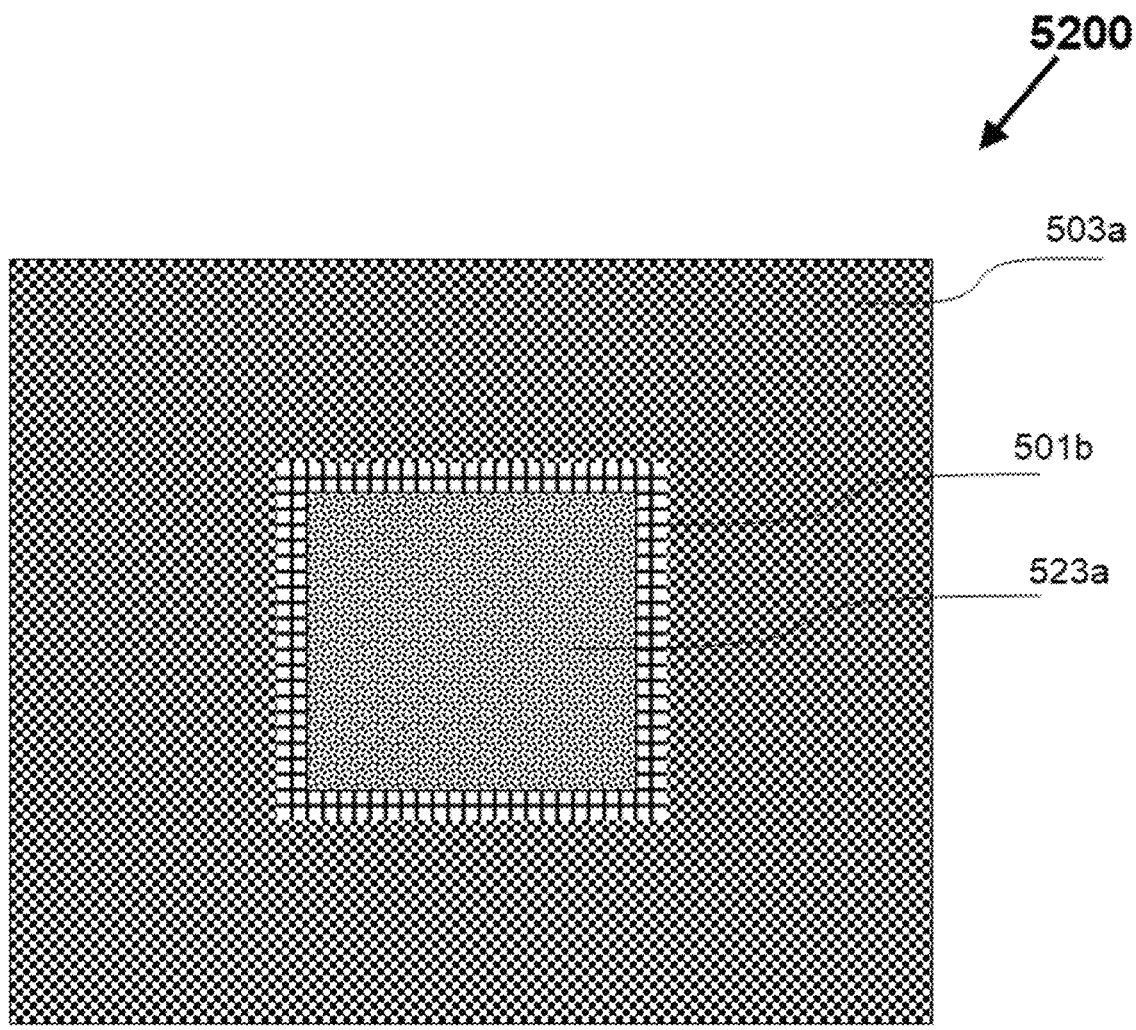

FIG. 6, FIG. 6A and FIG. 6B are schematic diagrams for illustrating a screen window liquid metal pad and some basic steps for making the same of one preferred embodiment of the present invention. The numerical symbol 5000 in FIG. 6 designates a screen window liquid metal pad from its cross-sectional view, in which the numerical symbols 501, 502 and 503 respectively designate a structural sheet (referring to FIG. 1 and FIG. 1A for its detailed description), a top piece with a window and a bottom piece with a window, the bottom piece is formed through a double sided adhesive sheet in the example, including an adhesive layer 502a and a protective layer 502b; the numerical symbols 510 designates a screen window, which is formed by stacking the bottom piece 502, the top piece 503 and the structural sheet 501 together such that the windows of the top and bottom pieces are aligned to form a frame 504 with a window 504a and a peripheral portion 501b of the structure sheet 501 is fixed between the top and bottom pieces and its remaining portion 501a forms a window screen covering the window 504a of the frame 504; and the numerical symbol 520 designates a screen window liquid metal pad, which is formed by spreading a liquid metal based filling material 521 as illustrated by the arrow 522 onto the window screen 501a such that the liquid metal based filling material 521 fills in and covers at least a middle portion of the window screen 501a as designated by the numerical symbol 523. It is noted that because the structure sheet 501 includes a plurality of through holes, the liquid metal based filling material 521 needs to be filled in these holes such that the screen window liquid metal pad 520 can have a good thermal performance. The numerical symbol 5100 in FIG. 6A designates a top view of the screen window 510 as shown in FIG. 6, in which the 503a and 501b respectively designate the top piece 503 and the structure sheet 501 from their top views. The numerical symbol 5200 in FIG. 6B designates a top view of the screen window liquid metal pad 520 as shown in FIG. 6, in which the 503a, 501b and 523a respectively designate the top piece 503, the structure sheet 501 and the liquid metal based filling material 523 from their top views.

It is noted that even though the bottom piece 502 and the top piece 503 are respectively formed through a double sided adhesive sheet and a compressible sheet of the preferred embodiment as described in conjunction with the drawings in FIG. 6, FIG. 6A and FIG. 6B, the material to form them is selectable and designable according to a specific application, where some options include an adhesive sheet, a double sided adhesive sheet and a compressible sheet, including a foam sheet, a cotton sheet, a soft paper and a fiberglass cloth. The liquid metal based filling material is also selectable and designable, where some options include a pure gallium, a gallium alloy and a gallium based paste with thermally conductive particles, like diamond powder. It is also noted that the structural sheet is preferably formed through a thermally conductive mesh, such as a copper mesh, a nickel plated copper mesh and a carbon fiber mesh, and that the shape of the window 504a is selectable and designable according to a specific application, and is not limited to the rectangular shape in the illustrative example.

Figure 7:
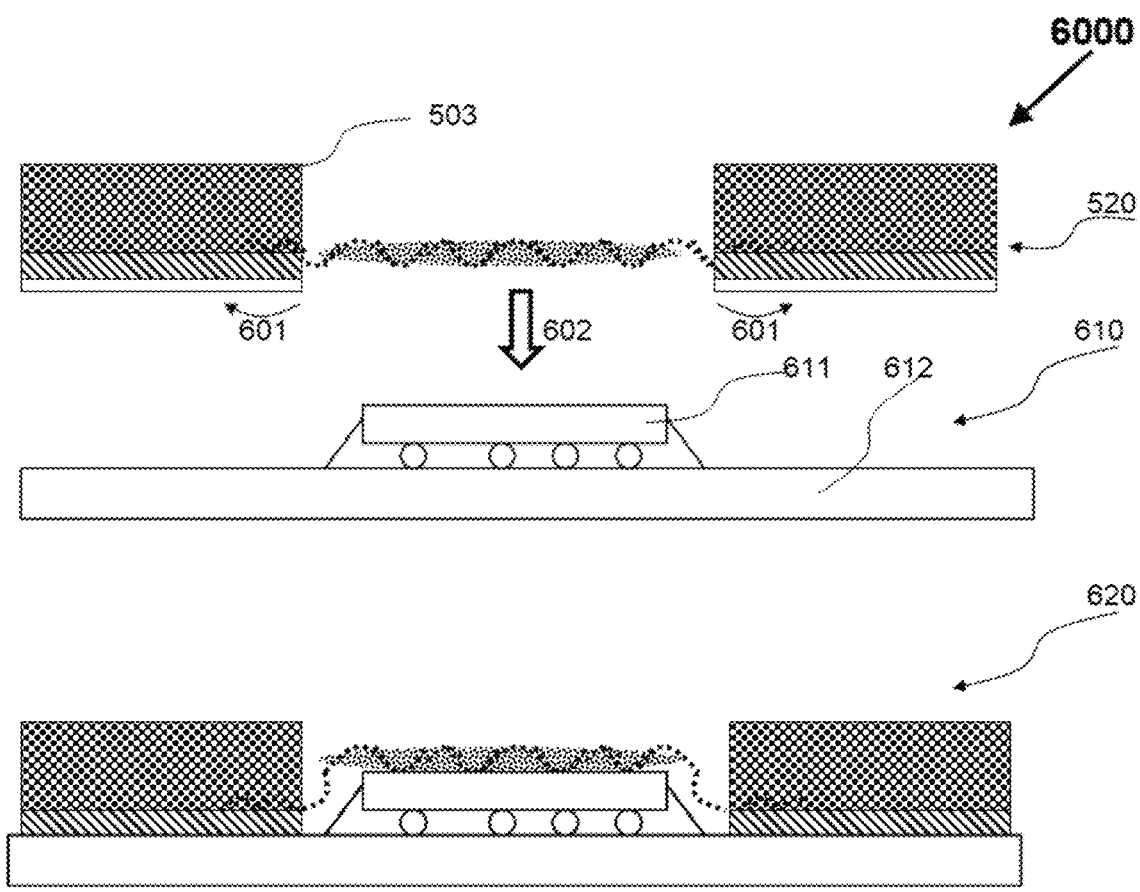
FIG. 7 and FIG. 7A are schematic diagrams for illustrating that a screen window liquid metal pad is disposed between a heatsink and a flip chip package of one preferred embodiment of the present invention.
Figure 7A:
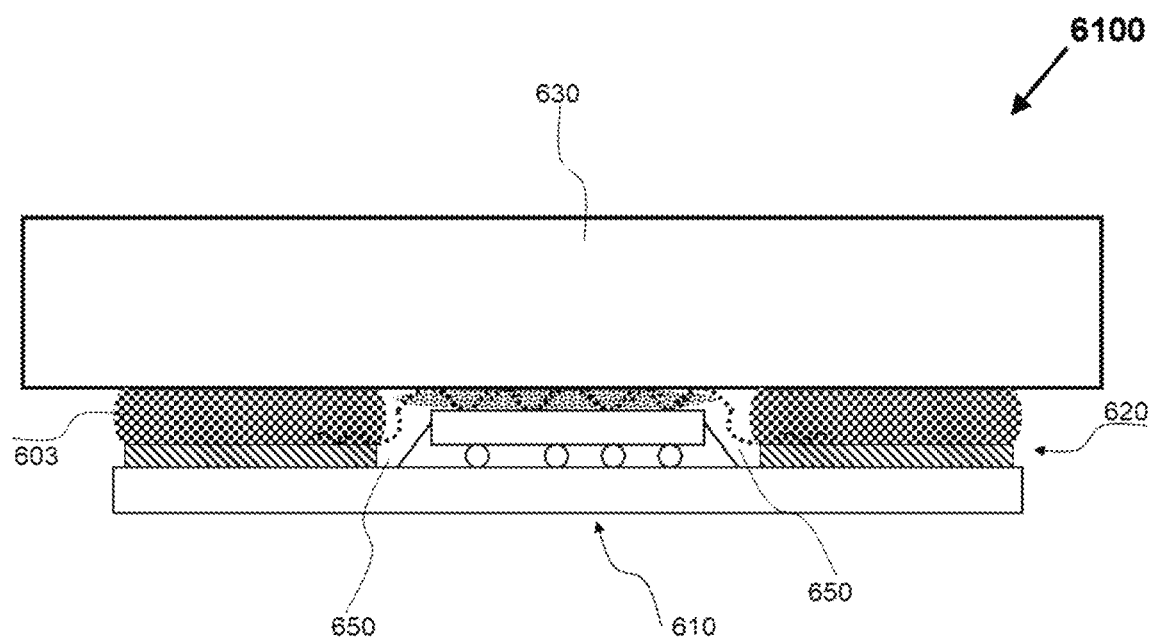

FIG. 7 and FIG. 7A are schematic diagrams for illustrating that a screen window liquid metal pad is disposed between a heatsink and a flip chip package of one preferred embodiment of the present invention. The numerical symbol 6000 in FIG. 7 is for illustrating how a screen window liquid metal pad 520 can be applied onto a flip chip package, in which the arrow 601 illustrates peeling away the protective layer 502b of the bottom piece 502 of the screen window liquid metal pad 520, the arrow 602 illustrates attaching the screen window liquid metal pad 520 onto a flip chip package 610 which includes a flip chip 611 mounted on a substrate 612, and the 620 designates the flip chip package 610 attached with the screen window liquid metal pad 520, wherein the window screen of the screen window liquid metal pad 520 covers the flip chip 611 and the frame is bonded to the substrate 612 around the flip chip 611. The numerical symbol 6100 in FIG. 7A is for illustrating how a heatsink 630 can be applied onto the flip chip package 610 attached with the screen window liquid metal pad 520, in which the heatsink 630 and the flip chip package 610 are the two opposing elements of an electronic device, the screen window liquid metal pad 520 is placed between the heatsink 630 and the flip chip package 610 such that its window screen covers the flip chip and its frame 603 forms a seal surrounding the flip chip 611 and between the heatsink 630 and the substrate 612. It is noted that the seal 603 is formed by tightly clamping the frame of the screen window liquid metal pad 520, which includes a compressible sheet as its top piece or bottom piece, and that the window screen with the liquid metal is clamped between the heatsink 630 and the flip chip 611. It is also noted that a cavity 650 is formed between the seal 603 and the flip chip 611, which forms a reservoir to accept a liquid metal in case it flows out from the gap between the flip chip 611 and the heatsink 630.

Figure 8:
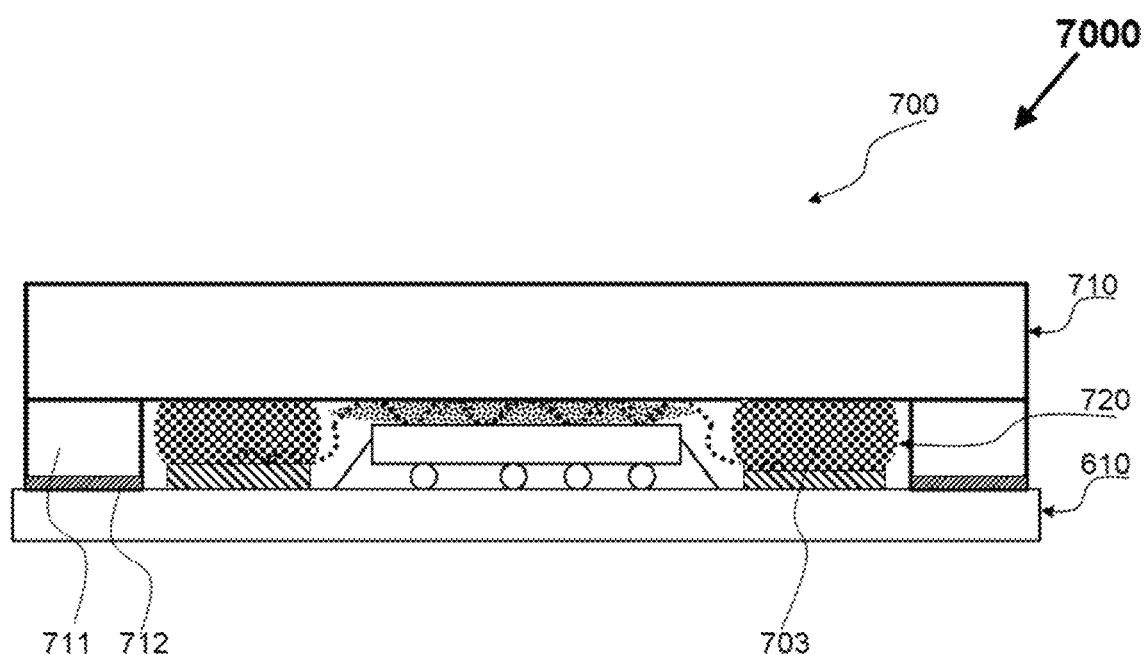
FIG. 8 is a schematic diagram for illustrating that a screen window liquid metal pad is disposed between a lid and a flip chip package of a lidded flip chip package of another preferred embodiment of the present invention.

FIG. 8 is a schematic diagram for illustrating that a screen window liquid metal pad is disposed between a lid and a flip chip package of a lidded flip chip package of another preferred embodiment of the present invention. The numerical symbol 7000 in FIG. 8 designates a lidded flip chip package 700, in which the lid 710 and the flip chip package 610 are the two opposing elements of an electronic device, the screen window liquid metal pad 720 is placed between the lid 710 and the flip chip package 610 such that its window screen covers the flip chip 611 and its frame 703 forms a seal surrounding the flip chip 611 and between the lid 710 and the substrate 612.

Figure 9:
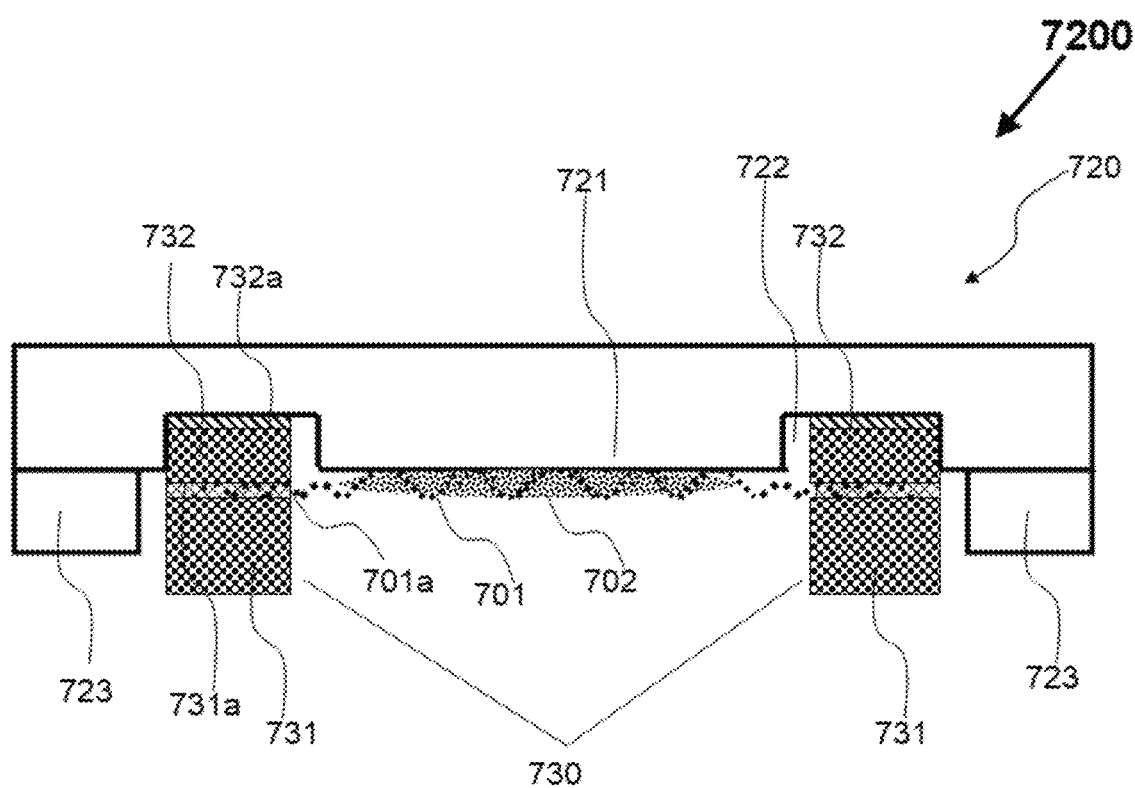
FIG. 9 and FIG. 9A are schematic diagrams for illustrating a lid integrated with a screen window liquid metal pad for a lidded flip chip package of another preferred embodiment of the present invention.
Figure 9A:
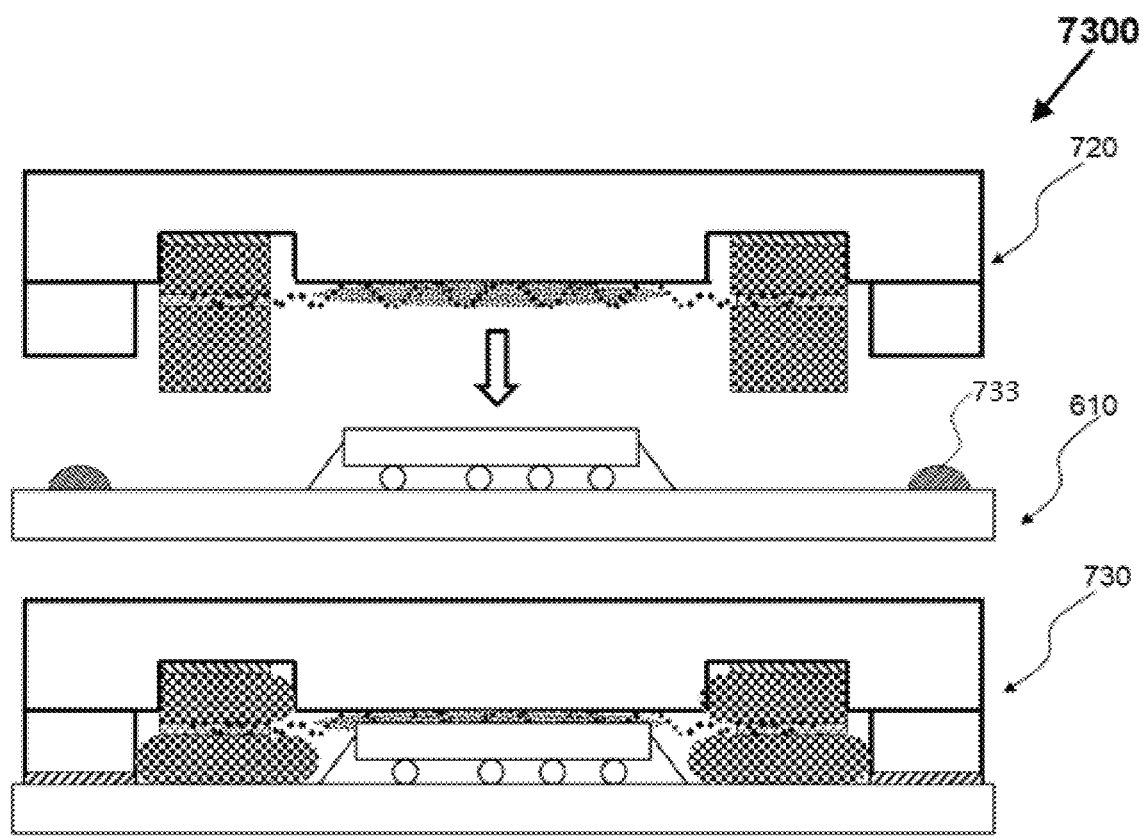

FIG. 9 and FIG. 9A are schematic diagrams for illustrating a lid integrated with a screen window liquid metal pad for a lidded flip chip package of another preferred embodiment of the present invention. The numerical symbol 7200 in FIG. 9 designates a lid 720 integrated with a screen window liquid metal pad 730, in which the numerical symbols 721, 722 and 723 respectively designate a pedestal, a notch and a foot of the lid 720, the 731 and 732 respectively designate a bottom piece and a top piece of a frame of the screen window liquid metal pad 730, the 731a designates an adhesive layer for bonding the top piece 732 and the bottom piece 731 together to form the frame and fix a peripheral portion 701a of the structure sheet 701 between the two pieces 731/732, the 732a designates an adhesive layer for bonding the top piece 732 or the screen window liquid metal pad 730 to the lid surrounding the pedestal 721, and the 702 designates a liquid metal based filling material which fills in and covers a middle portion of the window screen 701. The numerical symbol 7300 in FIG. 9A is for illustrating how the lid 720 integrated with a screen window liquid metal pad 730 can be applied to a flip chip package 610, in which the 733 designates an adhesive for bonding the foot 723 of the lid 720 onto a peripheral region of the substrate of the flip chip package 610, the 730 designates a lidded flip chip package with the lid 720 attached, wherein the frame with the bottom and top pieces 731/732 is compressed between the lid and the substrate so as to form a seal surrounding the flip chip, while a middle portion of the window screen 701 with the liquid metal based filling material 702 is clamped between the pedestal 721 of the lid and the flip chip so as to form a thermal interface material for heat transfer from the flip chip to the lid. It is noted that the bottom and top pieces 731/732 are formed through a compressible material of the preferred embodiment such that they are deformed under a compression to form a seal.

Figure 10:
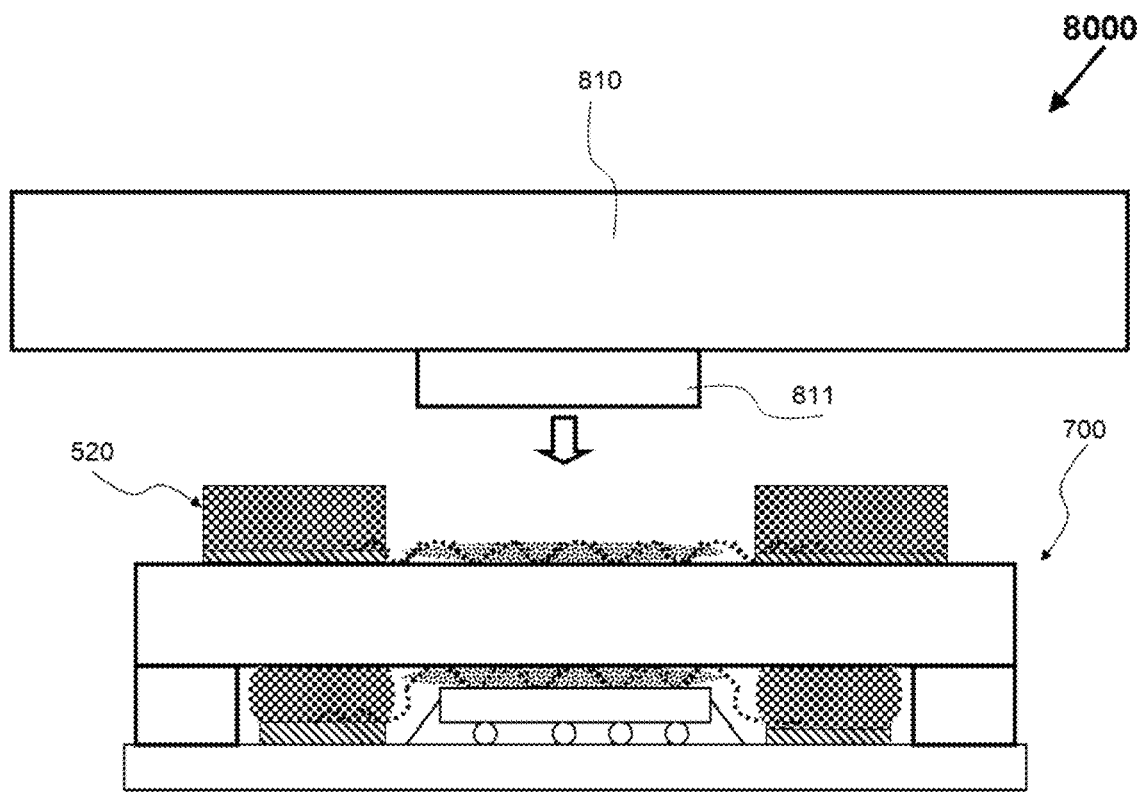
FIG. 10 and FIG. 10A are schematic diagrams for illustrating that a screen window liquid metal pad is disposed between a heatsink and a lidded flip chip package of another preferred embodiment of the present invention.
Figure 10A:
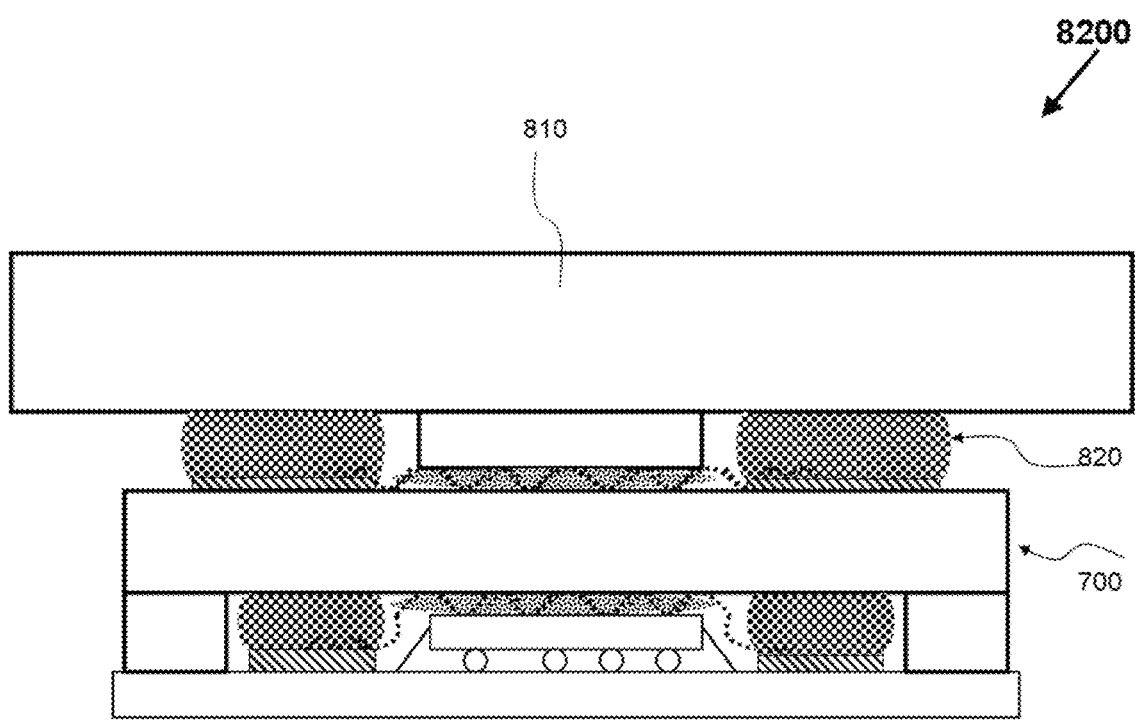

FIG. 10 and FIG. 10A are schematic diagrams for illustrating that a screen window liquid metal pad is disposed between a heatsink and a lidded flip chip package of another preferred embodiment of the present invention. The numerical symbol 8000 in FIG. 10 is for illustrating how a screen window liquid metal pad 520 can be applied between a heatsink 810 and a lidded flip chip package 700, wherein the screen window liquid metal pad 520 is attached onto the lidded flip chip package 700, the heatsink 810 with a pedestal 811 is then attached onto the screen window liquid metal pad 520 such that the pedestal 811 is placed onto the window screen with the liquid metal based filling material. The numerical symbol 8200 in FIG. 10A designates a lidded flip chip package 700 attached with a heatsink 810, wherein the screen window liquid metal pad 820 is placed between the heatsink 810 and the lidded flip chip package 700 such that its window screen covers a middle portion of the lidded flip chip package 700 and its frame forms a seal surrounding the pedestal 811 and between the heatsink 810 and the lidded flip chip package 700.

The spirit and scope of the present invention is to use a sheet structure with a first structure and a second structure to form a structural thermal interface pad and a screen window liquid metal pad to achieve an ideal thermal interface pad, wherein the first structure is for a filling material to pass from one side to the other of the structure sheet, and the second structure can work as a compressible/recoverable element so as to match a deformation or warpage of a heat generating element and/or a heat dissipating element of an electronic device. According to the spirit and scope of the present invention, various structural thermal interface pads by adding some other features can be flexibly designed.

Although the present invention is described in some details for illustrative purpose with reference to the specific embodiments and drawings, it is apparent that many other modifications and variations may be made without departing from the spirit and scope of the present invention.

The invention claimed is:

1. A screen window liquid metal pad disposed between two opposing elements of an electronic device so as to provide a thermal pathway for an efficient heat transfer from one element of the two opposing elements to the other element of the two opposing elements, wherein said screen window liquid metal pad comprises of:

A screen window with a structure sheet and a liquid metal based filling material;

wherein the structural sheet with a top surface and a bottom surface includes a first structure and a second structure, the first structure is an array of small holes completely passing through the structural sheet from its top surface to its bottom surface, and the second structure is an array of convex and/or concave bowls on the top surface and/or on the bottom surface of the structural sheet;

wherein the screen window further includes a frame with a window, the frame includes a top piece and a bottom piece, a peripheral portion of the structure sheet is located between the top piece and the bottom piece, and its remaining portion forms a window screen, which covers the window of the frame; and wherein the liquid metal based filling material fills in and covers at least a middle portion of the window screen.

2. The screen window liquid metal pad of claim 1, wherein the liquid metal based filling material includes a pure gallium, a gallium alloy or a gallium based paste filled with thermally conductive particles.

3. The screen window liquid metal pad of claim 1, wherein the bottom piece of the frame is formed through a double sided adhesive sheet.

4. The screen window liquid metal pad of claim 1, wherein the top piece of the frame is formed through a double sided adhesive sheet.

5. The screen window liquid metal pad of claim 1, wherein the bottom piece is formed through a compressible sheet, including a foam sheet, a cotton sheet, a soft paper or a fiberglass cloth.

6. The screen window liquid metal pad of claim 1, wherein the top piece is formed through a compressible sheet, including a foam sheet, a cotton sheet, a soft paper or a fiberglass cloth.

7. The screen window liquid metal pad of claim 1, wherein the bottom and top pieces are formed through a compressible sheet, including a foam sheet, a cotton sheet, a soft paper or a fiberglass cloth.

8. The screen window liquid metal pad of claim 1, wherein the structural sheet is formed through a thermally conductive mesh, including a copper mesh, a nickel plated copper mesh or a carbon fiber mesh.

9. The screen window liquid metal pad of claim 1, wherein the two opposing elements are a heatsink and a flip chip package which includes a flip chip mounted on a substrate, the screen window liquid metal pad is placed between the heatsink and the flip chip package such that its window screen covers the flip chip and its frame forms a seal surrounding the flip chip and between the heatsink and the substrate.

10. The screen window liquid metal pad of claim 1, wherein the two opposing elements are a lid and a flip chip package which includes a flip chip mounted on a substrate, the screen window liquid metal pad is placed between the lid and the flip chip package such that its window screen covers the flip chip and its frame forms a seal surrounding the flip chip and between the lid and the substrate.

11. The screen window liquid metal pad of claim 1, wherein the two opposing elements are a heatsink with a pedestal and a lidded flip chip package which includes a lid and a flip chip package with a flip chip mounted on a substrate, the screen window liquid metal pad is placed between the heatsink and the lid so that its window screen covers at least a middle portion of the lid and its frame forms a seal surrounding the pedestal and between the heatsink and the lid.

12. The screen window liquid metal pad of claim 1, which is formed according to the following basic steps:

1) Prepare a bottom piece with a window by cutting a double sided adhesive sheet, which includes a top adhesive layer and a bottom adhesive layer;
2) Prepare a piece of structure sheet and cover it onto the window of the bottom piece, wherein its peripheral portion is bonded to the bottom piece through its top adhesive layer;
3) Prepare a top piece with a window by cutting a compressible sheet, and stack it onto the bottom piece with their windows aligned so that the bottom and top pieces form a frame with a window, wherein a peripheral portion of the piece of structure sheet is fixed between the top and bottom pieces and its remaining portion forms a window screen for the window of the frame;
4) Spread a liquid metal based filling material onto the window screen so that it fills in and covers at least a middle portion of the window screen.

\* \* \* \* \*